United States Patent
Bonilla et al.

(10) Patent No.: US 8,026,166 B2
(45) Date of Patent: Sep. 27, 2011

(54) INTERCONNECT STRUCTURES COMPRISING CAPPING LAYERS WITH LOW DIELECTRIC CONSTANTS AND METHODS OF MAKING THE SAME

(75) Inventors: Griselda Bonilla, Fishkill, NY (US); Tien Cheng, Bedford, NY (US); Lawrence A. Clevenger, LaGrangeville, NY (US); Stephan Grunow, Poughkeepsie, NY (US); Chao-Kun Hu, Somers, NY (US); Roger A. Quon, Rhinebeck, NY (US); Zhiguo Sun, Beacon, NY (US); Wei-tsui Tseng, Hopewell Junction, NY (US); Yiheng Xu, Hopewell Junction, NY (US); Yun Wang, Poughquag, NY (US); Hyeok-sang Oh, Fishkill, NY (US)

(73) Assignees: International Business Machines Corporation, Armonk, NY (US); Samsung Electronics Co., Ltd. (KR); Chartered Semiconductor Manufacturing Ltd., Singapore (SG)

( * ) Notice: Subject to any disclaimer, the term of this patent is extended or adjusted under 35 U.S.C. 154(b) by 344 days.

(21) Appl. No.: 12/190,131

(22) Filed: Aug. 12, 2008

(65) Prior Publication Data
US 2010/0038793 A1    Feb. 18, 2010

(51) Int. Cl.
H01L 21/4763    (2006.01)

(52) U.S. Cl. ........ 438/624; 438/622; 438/627; 438/687; 257/760; 257/E21.585

(58) Field of Classification Search ................... 438/622, 438/624, 627, 687; 257/760, E21.585
See application file for complete search history.

(56) References Cited

U.S. PATENT DOCUMENTS

| | | | |
|---|---|---|---|
| 6,323,519 B1 * | 11/2001 | Gardner et al. | 257/336 |
| 6,737,747 B2 * | 5/2004 | Barth et al. | 257/760 |
| 6,887,783 B2 | 5/2005 | Chen et al. | |
| 6,914,320 B2 | 7/2005 | Chen et al. | |
| 7,019,399 B2 | 3/2006 | Venkatraman et al. | |
| 7,239,017 B1 | 7/2007 | Yu et al. | |
| 7,282,438 B1 | 10/2007 | Yu et al. | |
| 7,749,892 B2 * | 7/2010 | Bonilla et al. | 438/624 |

* cited by examiner

*Primary Examiner* — Andy Huynh
(74) *Attorney, Agent, or Firm* — Cantor Colburn LLP; Yuanmin Cai

(57) ABSTRACT

Interconnect structures comprising capping layers with low dielectric constants and good oxygen barrier properties and methods of making the same are provided. In one embodiment, the integrated circuit structure comprises: an interlevel dielectric layer disposed above a semiconductor substrate; a conductive interconnect embedded in the interlevel dielectric layer; a first capping layer comprising $Si_wC_xN_yH_z$ disposed upon the conductive interconnect; a second capping layer comprising $Si_aC_bN_cH_d$ (has less N) having a dielectric constant less than about 4 disposed upon the first capping layer; and a third capping layer comprising $Si_wC_xN_yH_z$ disposed upon the second capping layer, wherein a+b+c+d=1.0 and a, b, c, and d are each greater than 0 and less than 1, and wherein w+x+y+z=1.0 and w, x, y, and z are each greater than 0 and less than 1.

7 Claims, 3 Drawing Sheets

INTERCONNECT STRUCTURES COMPRISING CAPPING LAYERS WITH LOW DIELECTRIC CONSTANTS AND METHODS OF MAKING THE SAME

BACKGROUND

1. Field of the Invention

This invention relates to integrated circuits, and particularly to interconnect structures comprising capping layers with low dielectric constants and good oxygen barrier properties.

2. Description of Background

Fabrication of an integrated circuit involves numerous processing steps. After impurity regions have been implanted within a semiconductor substrate and gate areas defined upon the substrate, an interlevel dielectric is formed across the topography to isolate the gate areas and the impurity regions. Interconnect routing is then placed across the semiconductor topography and connected to the impurity regions and/or the gate areas by ohmic contacts formed through the interlevel dielectric. The entire process of making ohmic contacts to the impurity regions and/or the gate areas and routing interconnect material between the ohmic contacts is described generally as "metallization". As the complexity of integrated circuits has increased, the complexity of the metallization compositions has also increased.

Aluminum and aluminum alloys were once the material of choice for forming interconnects. However, due to the current focus on increasing circuit density and speed, the use of copper as the interconnect material has grown significantly since copper exhibits lower resistivity and lower susceptibility to electromigration failure as compared to aluminum. Despite these advantages, one drawback of using copper is that it readily diffuses into the surrounding dielectric material during subsequent processing steps. To inhibit the diffusion of copper, copper interconnects are often capped with a protective barrier layer referred to as a "capping" layer or a "passivation" layer, such as silicon nitride.

Silicon carbide deposited using chemical vapor deposition (CVD) from a trimethylsilane source, which is commercially available from Applied Materials under the tradename of BLOK®, is currently used as a capping layer over copper interconnects formed by the damascene process. The compound with less nitrogen (N) (less than about 5 mol %), i.e., $Si_aC_bN_cH_d$, is referred to as "BLOK", and the compound with more N (about 10 mol % to about 25 mol %), i.e., $Si_wC_xN_yH_z$, is referred to as "NBLOK". BLOK has a lower dielectric constant of less than 4.0, whereas NBLOK has a dielectric constant of about 5.0. While BLOK is not a good oxygen barrier but is a good copper (Cu) barrier, NBLOK is both a good oxygen barrier and a good Cu barrier. In order to achieve low k capping while still providing a good oxygen barrier and a good Cu barrier layer, a bilayer has been designed with 5 to 10 nm of NBLOK as a bottom layer and 30 to 35 nm of BLOK as a top layer. These two capping layers have also been combined to form a bilayer cap comprising a layer of $Si_aC_bN_cH_d$ over a thinner layer of $Si_wC_xN_yH_z$ that adheres well to the copper surface. While this bilayer cap provides a significant reduction in the effective k value of the dielectric stack, it can undesirably exhibit electromigration failure. One of the reasons for this failure is that a seam forms in the CVD deposited $Si_wC_xN_yH_z$ layer (NBLOK) in the corners above the sidewalls of the copper interconnect. Thus, oxygen can migrate through the upper $Si_aC_bN_cH_d$ (BLOK) layer and through the seams of the thin $Si_wC_xN_yH_z$ (NBLOK) layer. As a result, the upper surface of the copper interconnect could become oxidized, thereby reducing adhesive forces between the Cu interconnect and the $Si_wC_xN_yH_z$ (NBLOK) layer and adversely affecting the electromigration properties of the bilayer cap.

SUMMARY

The shortcomings of the prior art are overcome and additional advantages are provided through the provision of an interconnect structure comprising capping layers with low dielectric constants and good oxygen barrier properties. In an embodiment, an integrated circuit structure comprises: an interlevel dielectric layer disposed above a semiconductor substrate; a conductive interconnect embedded in the interlevel dielectric layer; a first capping layer comprising $Si_wC_xN_yH_z$ disposed upon the conductive interconnect; a second capping layer comprising $Si_aC_bN_cH_d$ having a dielectric constant less than about 4 disposed upon the first capping layer; and a third capping layer comprising $Si_wC_xN_yH_z$ disposed upon the second capping layer, wherein a+b+c+d=1.0 and a, b, c, and d are each greater than 0 and less than 1, and wherein w+x+y+z=1.0 and w, x, y, and z are each greater than 0 and less than 1. In one embodiment, a portion of the second capping layer can be treated with a nitrogen bearing plasma.

In another embodiment, a method for forming an integrated circuit structure comprises: forming a conductive interconnect embedded in an interlevel dielectric layer disposed above a semiconductor substrate; depositing a first capping layer comprising $Si_wC_xN_yH_z$ upon the conductive interconnect; depositing a second capping layer comprising $Si_aC_bN_cH_d$ having a dielectric constant less than about 4 upon the first capping layer; and depositing a third capping layer comprising $Si_wC_xN_yH_z$ upon the second capping layer wherein a+b+c+d=1.0 and a, b, c, and d are each greater than 0 and less than 1, and wherein w+x+y+z=1.0 and w, x, y, and z are each greater than 0 and less than 1. The advantage of this method is that the initial seam is covered by $Si_aC_bN_cH_d$, allowing the third layer of $Si_wC_xN_yH_z$ to be deposited on a smooth surface of $Si_aC_bN_cH_d$ without any seam to prevent oxygen diffusion down to the Cu surface.

In yet another embodiment, an integrated circuit structure comprises: an interlevel dielectric layer disposed above a semiconductor substrate; a conductive interconnect embedded in the interlevel dielectric layer; a first capping layer comprising $Si_aC_bN_cH_d$ having a dielectric constant less than about 4 disposed upon the conductive interconnect; and a second capping layer comprising $Si_wC_xN_yH_z$ disposed upon the first capping layer, wherein a+b+c+d=1.0 and a, b, c, and d are each greater than 0 and less than 1, and wherein w+x+y+z=1.0 and w, x, y, and z are each greater than 0 and less than 1.

In still another embodiment, a method for forming an integrated circuit structure comprises: forming a conductive interconnect embedded in an interlevel dielectric layer disposed above a semiconductor substrate; depositing a first capping layer comprising $Si_aC_bN_cH_d$ having a dielectric constant less than about 4 upon the conductive interconnect; and depositing a second capping layer comprising $Si_wC_xN_yH_z$ upon the first capping layer, wherein a+b+c+d=1.0 and a, b, c, and d are each greater than 0 and less than 1, and wherein w+x+y+z=1.0 and w, x, y, and z are each greater than 0 and less than 1.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Figure 1:
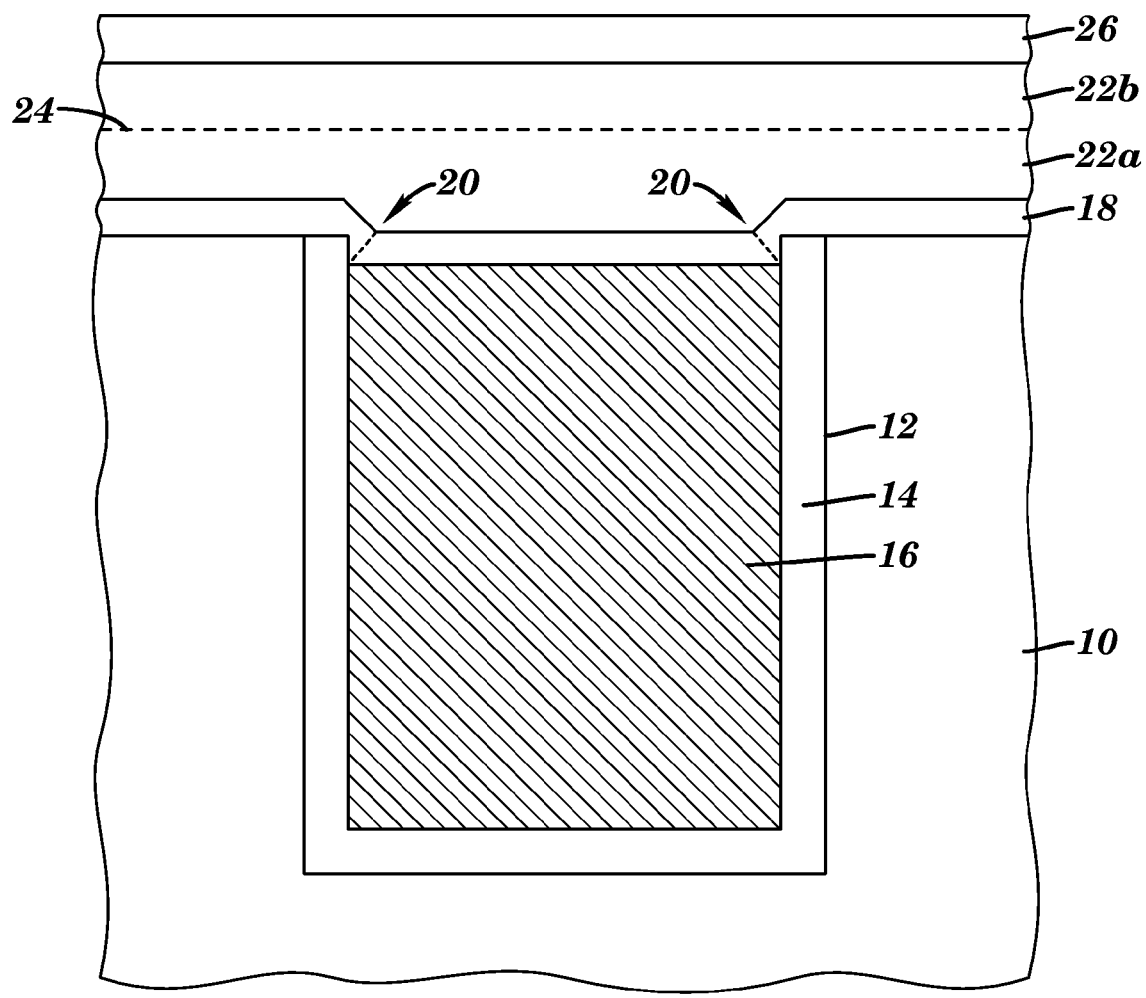
FIGS. 1-3 illustrates cross-sectional views of various embodiments of an interconnect structure comprising capping layers having low dielectric constants and good oxygen barrier properties.

Turning now to the drawings in greater detail, it will be seen that FIG. 1 illustrates a first embodiment of an interconnect structure comprising low k dielectric capping layers with improved electromigration properties. The interconnect structure can be formed above a semiconductor substrate (not shown) having active devices, e.g., field effect transistors (FETs), formed thereon. The interconnect structure comprises a conductive interconnect 16 embedded in an interlevel dielectric layer 10 and a tri-layer cap having a first capping layer 18 comprising $Si_wC_xN_yH_z$, a second capping layer 22 comprising $Si_aC_bN_cH_d$, and a third capping layer 26 comprising $Si_wC_xN_yH_z$ stacked upon the conductive interconnect 16. In all of the embodiments described herein, a+b+c+d=1.0 and a, b, c, d are each greater than 0 and less than 1; w+x+y+z=1.0 and w, x, y, and z are each greater than 0 and less than 1; and $Si_aC_bN_cH_d$ includes less N (comprises less than about 5 mol % N) than $Si_wC_xN_yH_z$ (comprises about 10 mol % to about 25 mol % N). The second capping layer 22 can include a region 24 treated with a nitrogen-bearing gas. It is understood that multiple levels of such interconnect structures can be formed above the substrate during the fabrication of an integrated circuit.

The above-described interconnect structure can be formed by first CVD depositing the interlevel dielectric layer 10 above another interlevel dielectric (not shown) in which contacts are formed to underlying source and drain regions of a substrate or to underlying interconnect. The interlevel dielectric layer 10 can comprise, for example, silicon dioxide, tetraethyl orthosilicate (TEOS), SiCOH, or combinations comprising at least one of the foregoing. A trench 12 can then be formed in the interlevel dielectric layer 10 using, e.g., lithography and an anisotropic etch technique such as reactive ion etching (RIE). A barrier layer 14, e.g., tantalum and tantalum nitride, can optionally be CVD deposited along the walls of the trench 12 and across the surface of the interlevel dielectric layer 10 to form a diffusion barrier in the trench 12. Subsequently, the interconnect material 16, e.g., a metal such as copper (Cu) or aluminum (Al) or alloys of metals, can be deposited upon the barrier layer 14 in the trench 12 to a level above the upper surface of the interlevel dielectric layer 10. This deposition of the interconnect material 16 can be performed using metal-organic CVD or a physical vapor deposition process such as sputtering. The interconnect material 16 and the barrier layer 14 can then be removed, e.g., by chemical-mechanical polishing (CMP), from above the upper surface of the interlevel dielectric layer 10 such that an interconnect 16 having a polished upper surface that is coplanar or near coplanar with the upper surface of the interlevel dielectric layer 10 is formed within the trench 12. Also, the barrier layer 14 forms a liner around the walls of the trench 12 for inhibiting the diffusion of the interconnect material into the interlevel dielectric layer 10.

The next step of forming the interconnect structure shown in FIG. 1 involves depositing a thin first capping layer 18 comprising $Si_wC_xN_yH_z$ upon the conductive interconnect 16. This deposition can be performed by plasma-enhanced CVD (PECVD) from a gas mixture comprising trimethylsilane ($(CH_3)_3SiH$) and ammonia ($NH_3$), and/or nitrogen ($N_2$). The PECVD of the first capping layer 18 can be performed at a temperature of about 350 to about 450° C. and a pressure of about 3 to about 5 Torr for a period of time effective to form a thickness of about 10 to about 500 Angstroms (Å), specifically about 10 to about 200 Å, or more specifically about 10 to 50 Å. A portion of the second capping layer 22a, which comprises $Si_aC_bN_cH_d$, can subsequently be deposited across the first capping layer 18. This deposition can be performed by PECVD at a temperature of about 300° C. to about 450° C. and a pressure of about 4 to about 7.5 Torr for a period of time effective to form a thickness of about 10 to about 2000 Å, specifically about 10 to about 500 Å, or more specifically about 10 to 400 Å. The PECVD can be terminated in the middle of forming the second capping layer 22 to allow a region 24 of the second capping layer portion 22a to be treated with a nitrogen-bearing plasma. By way of example, the second capping layer portion 22a can be exposed to a plasma comprising $NH_3$, $N_2$, or a combination thereof at a temperature of about 300 to about 450° C. and a pressure of about 1 to about 5 Torr (more specifically about 1 to about 3 Torr) for a period of time effective to form a treated layer 24 having a thickness of about 8 Å to about 20 Å. The remaining portion of the second capping layer 22b can be formed upon treated layer 24 by continuing the $Si_aC_bN_cH_d$ deposition process described above for a period of time effective to form the second portion of the capping layer 22b to a thickness of 10 to about 2000 Å, specifically about 10 to about 800 Å, or more specifically about 10 to 600 Å. Finally, a third capping layer 26 comprising $Si_wC_xN_yH_z$ can be deposited across the second capping layer portion 22b in the same manner as the first capping layer 18. The first and third capping layers 18 and 26 can have near equivalent thicknesses while the second capping layer 22 is larger in thickness than either of the first and third capping layers 18 and 26.

The interconnect structure depicted in FIG. 1 is strategically formed to improve the electromigration properties thereof. In particular, the thin first capping layer 18, which comprises $Si_wC_xN_yH_z$, serves to improve the adhesion to the underlying interconnect 16 and has a low k value of about 5 to about 6, specifically about 5.5. While the first capping layer 18 can include seams 20 at the corners above the sidewalls of the interconnect 16 since it is formed upon a polished interconnect surface, the overlying capping layers provide protection against the diffusion of oxygen through those seams 20. In particular, the treated layer 24 extending through the second capping layer 22, which comprises $Si_aC_bN_cH_d$, includes additional N atoms incorporated therein and thus acts a good barrier to oxygen. This treated layer 24 desirably has a k value of about 4.2 to about 4.4, specifically about 4.3 to about 4.4, or more specifically about 4.3, and is desirably located near the middle of the second capping layer 22. Also, the second capping layer 22 has a k value of less than about 4, more specifically about 3.5 to about 3.8, or even more specifically about 3.6, which is advantageously lower than the k value of the first capping layer 18. The third capping layer 18, which also comprises $Si_wC_xN_yH_z$, is disposed at the top of the trilayer structure and thus provides an initial barrier to oxygen having a low k value like that of the first capping layer 18.

In alternative embodiments, a portion of the first capping layer 18, the third capping layer 26, or combinations comprising the first, second, or third capping layers is treated with the nitrogen bearing plasma in the same manner as the second capping layer 22. When a portion of the first capping layer 18 or the third capping layer 26 is treated with a nitrogen bearing plasma, the treated portion can have a dielectric constant of about 5.3 to about 5.4, specifically about 5.35.

Figure 2:
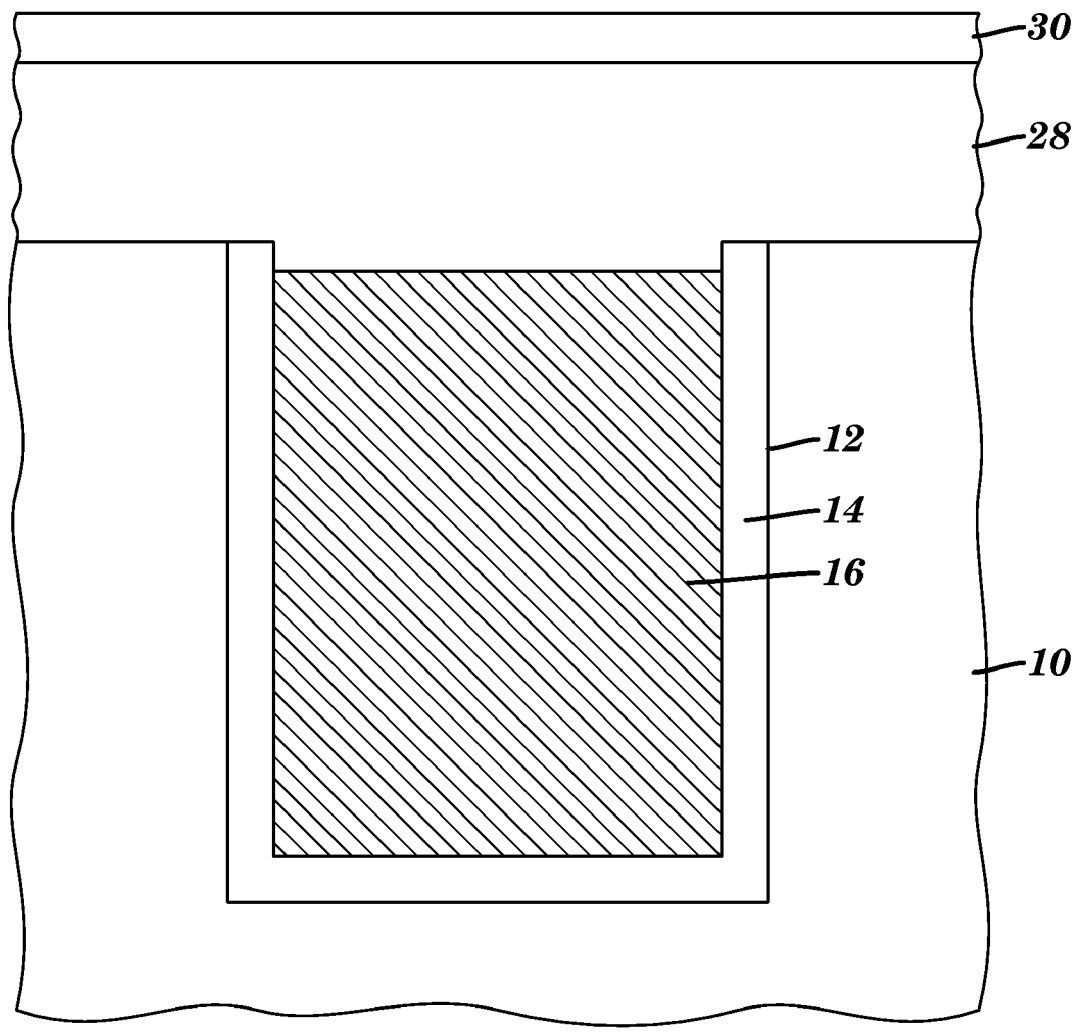

Turning now to FIG. 2, another embodiment of an interconnect structure having low k dielectric layers is shown that is similar to the embodiment shown in FIG. 1 except that it includes a bilayer cap having a first capping layer 28 comprising $Si_aC_bN_cH_d$ and a second capping layer 30 comprising $Si_wC_xN_yH_z$. As in FIG. 1, the interconnect structure depicted in FIG. 2 also includes a conductive interconnect 16 and a barrier layer 14 embedded in a trench 12 formed in an interlevel dielectric layer 10. The interlevel dielectric layer 10, trench 12, barrier layer 14, and conductive interconnect 16 can be formed in the same manner as described previously. Then, the first capping layer 28 comprising $Si_aC_bN_cH_d$ can be deposited across the interconnect 16 and the surface of the interlevel dielectric layer 10. This deposition can be performed by PECVD from trimethylsilane at a temperature of about 300 to about 450° C. and a pressure of about 4 to about 7.5 Torr for a period of time effective to form a thickness of about 10 to about 1000 Å, specifically about 10 to about 500 Å, or more specifically about 10 to 100 Å. The first capping layer 28, which comprises $Si_aC_bN_cH_d$, advantageously has a low k value of less than about 4, more specifically about 3.5 to about 3.8, or even more specifically about 3.6.

The next step involves depositing a thin second capping layer 30 comprising $Si_wC_xN_yH_z$ across the first capping layer 28. This deposition can be performed by PECVD from trimethylsilane $((CH_3)_3SiH)$ and $NH_3$ and/or $N_2$ at a temperature of about 300 to about 450° C. and a pressure of about 3 to about 5 Torr for a period of time effective to form a thickness of about 10 to about 500 Å, specifically about 10 to about 200 Å, or more specifically about 10 to 50 Å. This second capping layer 30 has a low k value of about 5 to about 6, specifically about 5.5. Moreover, the second capping layer 30 provides even better protection against the diffusion of oxygen than the underlying capping layer 28 because the step is smoothed out at the top surface of layer 28 and there is no seam in the layer 30 to allow for the diffusion of oxygen.

In alternative embodiments, a portion of the first capping layer 28, the second capping layer 30, or each of the first and second capping layers 28 and 30 depicted in FIG. 2 is treated with the nitrogen bearing plasma in the same manner as described with respect to FIG. 1.

Figure 3:
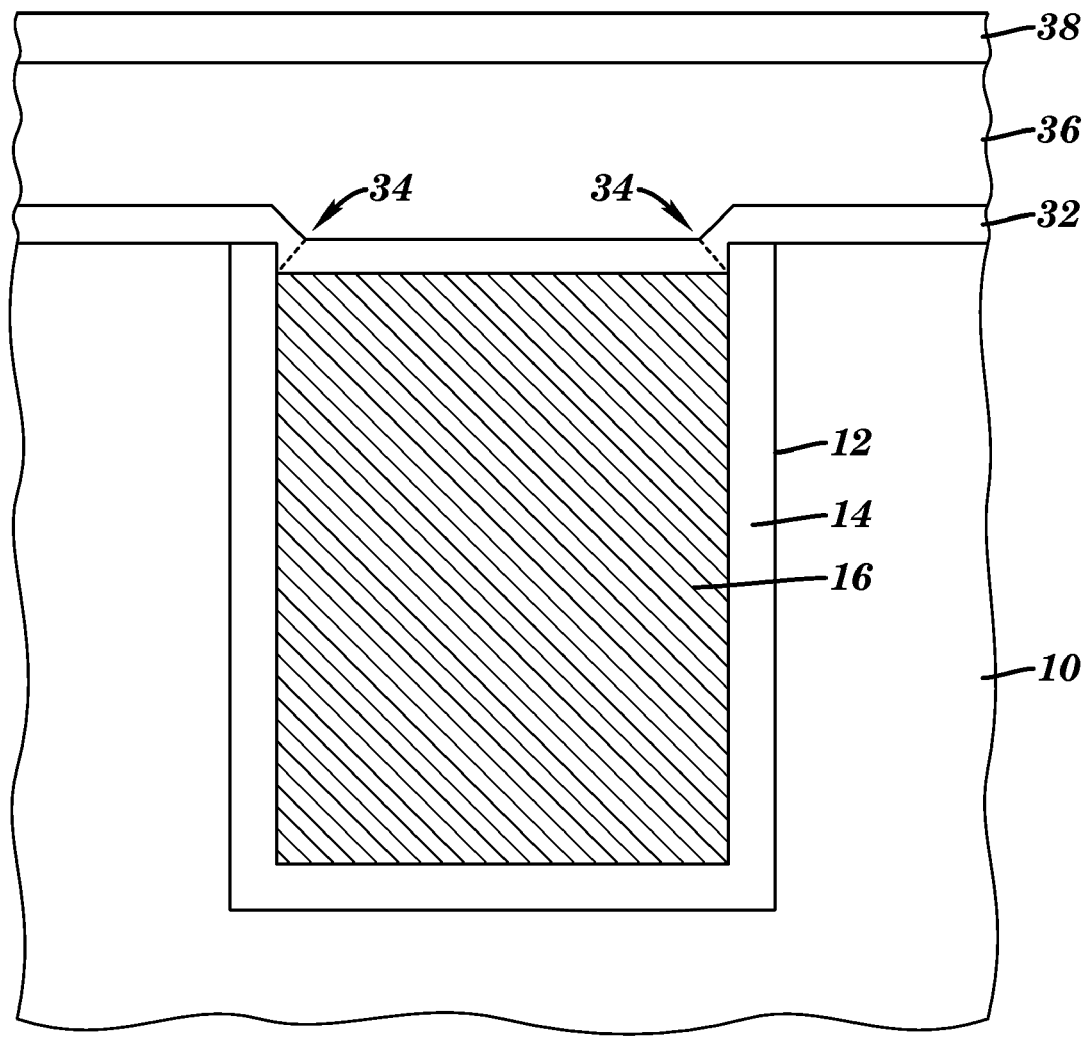

FIG. 3 depicts yet another embodiment of an interconnect structure having a trilayer cap like that shown in FIG. 1 except that the second capping layer 36 does not include a region treated with a nitrogen bearing plasma. As in FIG. 1, the interconnect structure includes a barrier layer 14 and a conductive interconnect 16 disposed in a trench 12 formed in an interlevel dielectric layer 10. The trilayer cap includes a first capping layer 32 comprising $Si_wC_xN_yH_z$ disposed upon the upper surfaces of the conductive interconnect 16 and the interlevel dielectric layer 10. The thickness of the first capping layer 32 can range from about 10 to about 500 Å, specifically about 10 to about 200 Å, or more specifically about 10 to 50 Å. Due to the thinness and the composition of the first capping layer 32, seams 34 may be present in the first capping layer 32 above the upper corners of the conductive interconnect 16. The trilayer cap further includes a second capping layer 36 comprising $Si_aC_bN_cH_d$ disposed upon the first capping layer 32 and a third capping layer 38 comprising $Si_wC_xN_yH_z$ disposed upon the second capping layer 36. The second capping layer 36 can have a thickness of about 10 to about 2000 Å, specifically about 10 to about 500 Å, or more specifically about 10 to 100 Å, and the third capping layer can have a thickness of about 10 to about 500 Å, specifically about 10 to about 200 Å, or more specifically about 10 to 50 Å. These capping layers 32, 36, and 38 can be formed in the same manner as the three capping layer shown in FIG. 1 except that the deposition of the second capping layer 36 need not be interrupted for treatment with a nitrogen bearing plasma.

The first capping layer 32 in FIG. 3, which comprises $Si_wC_xN_yH_z$, serves to improve adhesion to the underlying interconnect 16 and can act as a good diffusion barrier next to the interconnect 16; however it may have a seam near the step that can form a pass for oxygen diffusion. The second capping layer 36, which comprises $Si_aC_bN_cH_d$, is placed in the middle of the trilayer cap because it lowers the effective k value of the trilayer cap. A seamless third capping layer 38, which comprises $Si_wC_xN_yH_z$, is strategically placed at the top of the trilayer cap to provide a good initial barrier against the diffusion of oxygen.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt. % to about 20 wt. %," is inclusive of the endpoints and all intermediate values of the range of about 5 wt. % to about 20 wt. %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for forming an integrated circuit structure, comprising:

forming a conductive interconnect embedded in an interlevel dielectric layer disposed above a semiconductor substrate;

depositing a first capping layer comprising $Si_wC_xN_yH_z$ upon the conductive interconnect;

depositing a second capping layer comprising $Si_aC_bN_cH_d$ having a dielectric constant less than about 4 upon the first capping layer;

depositing a third capping layer comprising $Si_wC_xN_yH_z$ upon the second capping layer, wherein the second capping layer has a lower nitrogen content than the first capping layer, and wherein the second capping layer has a lower nitrogen content than the third capping layer, wherein the second capping layer has a treated layer extending therethrough, between top and bottom surfaces of the second capping layer, wherein the treated layer incorporates includes additional nitrogen atoms incorporated therein with respect to untreated portions of the capping layer, wherein a+b+c+d=1.0 and a, b, c, and d are each greater than 0 and less than 1, and wherein w+x+y+z=1.0 and w, x, y, and z are each greater than 0 and less than 1.

2. The method of claim 1, further comprising treating a portion of the second capping layer with a nitrogen-bearing plasma.

3. The method of claim 2, wherein said treating the second capping layer with the nitrogen bearing plasma comprises exposing the substrate to a plasma comprising ammonia, nitrogen gas, or a combination thereof at a temperature of about 300 to about 450° C. and a pressure of about 1 to about 5 Torr for a period of time effective to form a treated layer having a thickness of about 8 Angstroms to about 20 Angstroms.

4. The method of claim 1, further comprising treating a portion of the first capping layer, the second capping layer, the third capping layer, or combinations thereof with a nitrogen-bearing plasma by exposing the substrate to a plasma comprising ammonia, nitrogen gas, or a combination thereof at a temperature of about 300 to about 450° C. and a pressure of about 1 to about 5 Torr for a period of time effective to form a treated layer having a thickness of about 8 Angstroms to about 20 Angstroms.

5. The method of claim 1, wherein said depositing the first capping layer and said depositing the third capping layer comprises PECVD from trimethylsilane and $NH_3$ or $N_2$, or both $NH_3$ and $N_2$ at a temperature of about 300 to about 450° C. and a pressure of about 3 to about 5 Torr for a period of time effective to form a thickness of about 10 to about 2000 Angstroms.

6. The method of claim 1, wherein said depositing the second capping layer comprises PECVD from trimethylsilane at a temperature of about 300 to about 450° C. and a pressure of about 4 to about 7.5 Torr for a period of time effective to form a thickness of about 10 to about 2000 Angstroms.

7. The method of claim 1, wherein the second capping layer comprises less than about 5 mole % nitrogen.

* * * * *